US006942728B2

(12) United States Patent
Caillat et al.

(10) Patent No.: US 6,942,728 B2
(45) Date of Patent: Sep. 13, 2005

(54) HIGH PERFORMANCE P-TYPE THERMOELECTRIC MATERIALS AND METHODS OF PREPARATION

(75) Inventors: Thierry Caillat, Pasadena, CA (US); Alexander Borshchevsky, Santa Monica, CA (US); Jean-Pierre Fleurial, Duarte, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 10/262,807

(22) Filed: Oct. 1, 2002

(65) Prior Publication Data

US 2003/0066476 A1 Apr. 10, 2003

Related U.S. Application Data

(62) Division of application No. 08/820,019, filed on Mar. 18, 1997, now Pat. No. 6,458,319.

(51) Int. Cl.[7] .................. C30B 29/48
(52) U.S. Cl. .................. 117/3; 148/400; 420/576; 423/86; 423/622
(58) Field of Search .................. 420/576; 148/4 W; 117/3; 423/87, 622

(56) References Cited

U.S. PATENT DOCUMENTS

| | | | | | |
|---|---|---|---|---|---|
| 2,793,243 | A | * | 5/1957 | Lindenblad | |
| 3,021,378 | A | * | 2/1962 | Justi et al. | |
| 3,900,603 | A | * | 8/1975 | Rittmayer et al. | 427/124 |
| 3,988,171 | A | * | 10/1976 | Miller et al. | 136/237 |
| 4,447,277 | A | * | 5/1984 | Jayadev et al. | |
| 4,489,742 | A | * | 12/1984 | Moore et al. | |
| 4,902,648 | A | * | 2/1990 | Ohta et al. | 437/247 |
| 5,356,485 | A | * | 10/1994 | Kreider et al. | 136/225 |
| 5,726,381 | A | * | 3/1998 | Horio et al. | |
| 5,885,345 | A | * | 3/1999 | Sakuragi et al. | 117/16 |
| 6,127,766 | A | * | 10/2000 | Roidt | 310/306 |

FOREIGN PATENT DOCUMENTS

| | | | | |
|---|---|---|---|---|
| JP | 8-228027 | * | 9/1996 | 117/2 |

OTHER PUBLICATIONS

Caillat et al., "Zn–Sb alloys for thermoelectric power generation", Proceedings of the Intersociety Energy Conversion Engineering Conference (1996) abs only.*
Kostur et al., "Thermoelectric properties of zinc antimonides in relation to theri structural state", Nizkotemp. Termoelek Mater., (1970) pp. 131–135 abstract only.*
Tapiero et al., " Preparation and Characterization of Zn Sb ", Solar Energy Materials vol. 12 p. 257–274, 1985.*
Caillat et al, "Zn–Sb alloys for thermoelectric power generation", Proc. Intersoc. Energy Convers. Eng. Conf. 31 st pp. 905–909, abs only, 1996.*
Schnieder "Zonc Antimonide and its mixed crystals with cadmium" Adh. Braunschw. Wiss Ges vol. 18 abs only p. 131–164, 1966.*
Makino et al. "Improving thermoelectric properties of zinc antimonide" Nippon kinzoku Gakkaiushi vol. 28(1) 43–48 abs only, 1996.*

* cited by examiner

*Primary Examiner*—Robert Kunemund
(74) *Attorney, Agent, or Firm*—Fish & Richardson P.C.

(57) ABSTRACT

The present invention is embodied in high performance p-type thermoelectric materials having enhanced thermoelectric properties and the methods of preparing such materials. In one aspect of the invention, p-type semiconductors of formula $Zn_{4-x}A_xSb_{3-y}B_y$ wherein $0\leqq x\leqq 4$, A is a transition metal, B is a pnicogen, and $0\leqq y\leqq 3$ are formed for use in manufacturing thermoelectric devices with substantially enhanced operating characteristics and improved efficiency. Two methods of preparing p-type $Zn_4Sb_3$ and related alloys of the present invention include a crystal growth method and a powder metallurgy method.

1 Claim, 7 Drawing Sheets

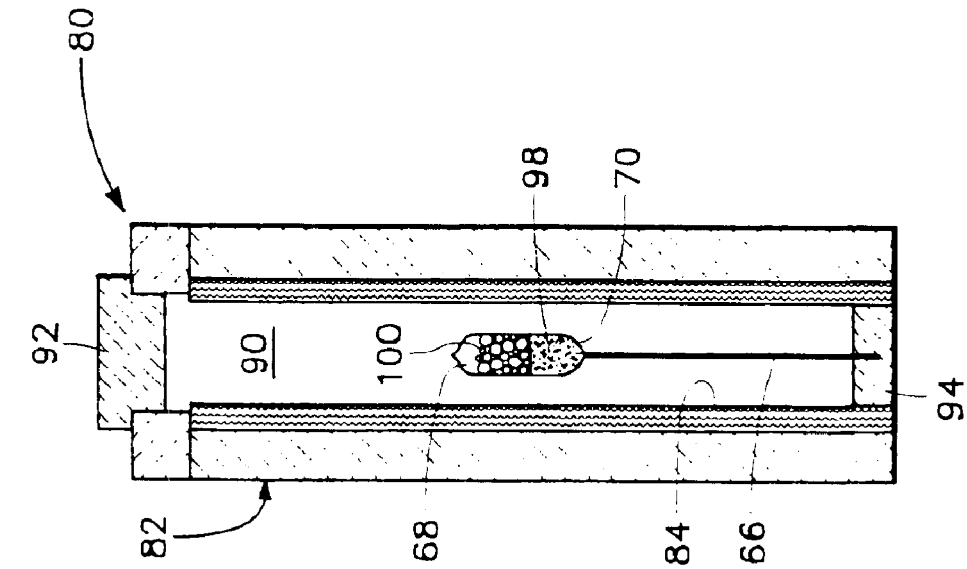
FIG. 4
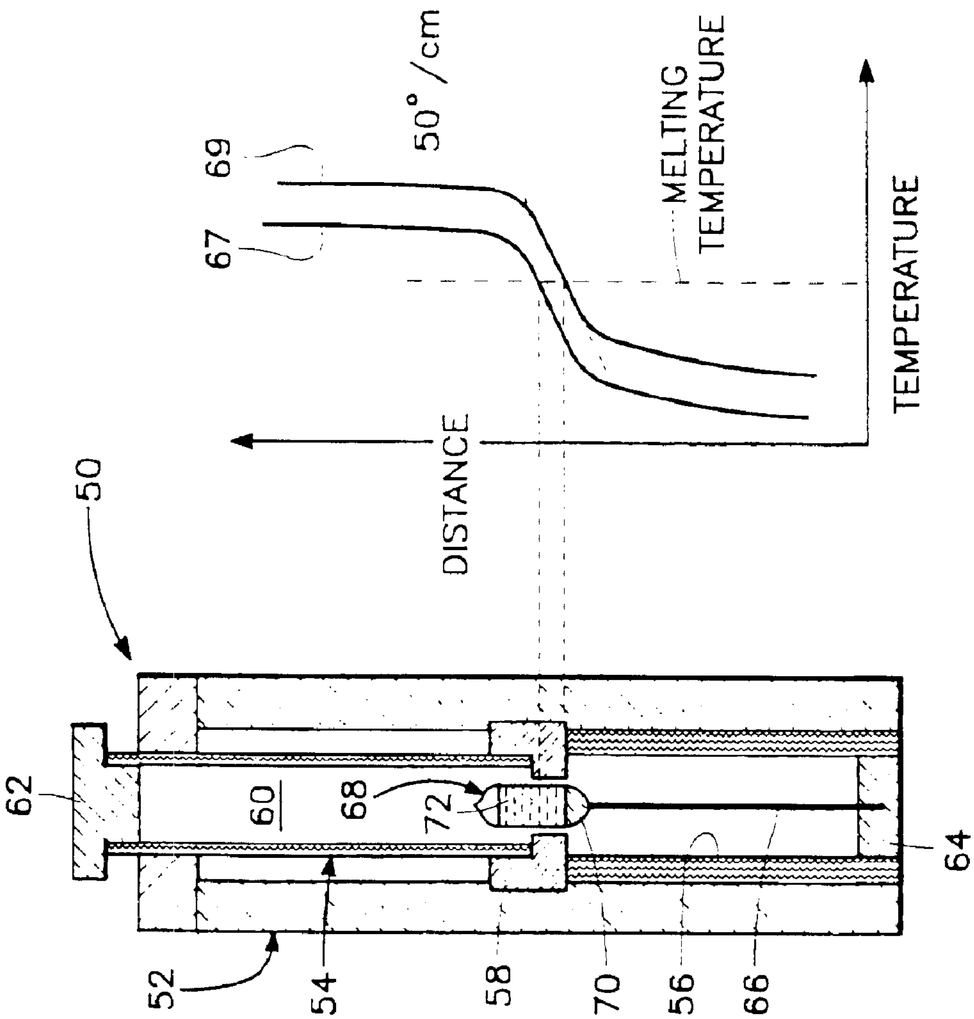
FIG. 3A
FIG. 3B

HIGH PERFORMANCE P-TYPE THERMOELECTRIC MATERIALS AND METHODS OF PREPARATION

This application is a divisional of U.S. application Ser. No. 08/820,019, filed Mar. 18, 1997 now U.S. Pat. No. 6,458,319.

ORIGIN OF THE INVENTION

The invention described herein was made in the performance of work under a NASA contract, and is subject to the provisions of Public Law 96-517 (35 U.S.C. §202) in which the Contractor has elected to retain title.

BACKGROUND OF THE INVENTION

1. Field of the Invention

This invention relates to semiconductor materials having enhanced thermoelectric properties and preparation of such materials.

2. Related Art

Thermoelectric generators convert heat energy directly into electrical energy without moving parts. They are reliable, operate unattended in hostile environments and are also environmentally friendly. The basic theory and operation of thermoelectric devices has been developed for many years. Such devices may be used for heating, cooling, temperature control, power generation and temperature sensing. Modern thermoelectric coolers typically include an array of thermocouples which operate by using the Peltier effect.

Thermoelectric devices are coolers, heat pumps, and power generators which follow the laws of thermodynamics in the same manner as mechanical heat pumps, refrigerators, or any other device used to transfer heat energy. The principal difference is that thermoelectric devices function with solid state electrical components (thermocouples) as compared to more traditional mechanical/fluid heating and cooling components. The efficiency of a thermoelectric device is generally limited to its associated Carnot cycle efficiency reduced by a factor which is dependent upon the thermoelectric figure of merit (ZT) of the materials used in fabrication of the thermoelectric device.

The dimensionless figure of merit ZT represents the coupling between electrical and thermal effects in a material and is defined as:

$$ZT=S^2\sigma T/\kappa \quad (1)$$

where S, σ, κ, and T are the Seebeck coefficient, electrical conductivity, thermal conductivity and absolute temperature, respectively. The basic thermoelectric effects are the Seebeck and Peltier effects. The Seebeck effect is the phenomenon underlying the conversion of heat energy into electrical power and is used in thermoelectric power generation. The complementary effect, the Peltier effect, is the phenomenon used in thermoelectric refrigeration and is related to heat absorption accompanying the passage of current through the junction of two dissimilar materials.

ZT may also be stated by the equation:

$$ZT = \frac{s^2 T}{\rho\kappa} \quad (2)$$

ρ=electrical resistivity
σ=electrical conductivity $$\text{electrical conductivity} = \frac{1}{\text{electrical resistivity}} \text{ or } \sigma = \frac{1}{\rho}$$

Thermoelectric materials such as alloys of $Bi_2Te_3$, PbTe and BiSb were developed thirty to forty years ago. Semiconductor alloys such as SiGe have also been used in the fabrication of thermoelectric devices. Commercially available thermoelectric materials are somewhat expensive. In addition, they are generally limited to use in a temperature range between 200 K and 1300 K with a maximum ZT value of approximately one. The efficiency of the thermoelectric devices using these materials remains relatively low at approximately five to eight percent (5–8%) energy conversion efficiency. For the temperature range of 200 to 300 K, maximum ZT of current state of the art thermoelectric materials remains limited to values of approximately 1, except for Te—Ag—Ge—Sb alloys (TAGS) which may achieve a ZT of 1.2 in a very narrow temperature range. Thermoelectric materials such as $Si_{80}Ge_{20}$ alloys used in thermoelectric generators to power spacecrafts for deep space missions have a ZT approximately equal to 0.7 from 500 to 1300 K.

However, for many applications with heat source temperature ranges between 100 C and about 350 C, there exists a gap between the low temperature state-of-the-art thermoelectric materials ($Bi_2Te_3$-based alloys) and the intermediate temperature materials (PbTe-based alloys) and TAGS (Te—Ag—Ge—Sb). Consequently, the applications of current thermoelectric materials are limited because of the relatively low efficiency of the thermoelectric materials as well as their relatively high cost.

Therefore, what is needed are more efficient new thermoelectric materials. In addition, what is needed are inexpensive thermoelectric materials. What is further needed are new thermoelectric materials with an expanded range of applications.

Whatever the merits of the prior techniques and methods, they do not achieve the benefits of the present invention.

SUMMARY OF THE INVENTION

To overcome the limitations in the prior art described above, and to overcome other limitations that will become apparent upon reading and understanding this specification, the present invention discloses new high performance p-type thermoelectric materials having enhanced thermoelectric properties and the methods of preparing such materials.

In accordance with one aspect of the present invention, p-type semiconductor materials are formed from alloys of $Zn_4Sb_3$ for user in manufacturing thermoelectric devices with substantially enhanced operating characteristics and improved efficiency as compared to previous thermoelectric devices.

Two methods of preparing p-type $Zn_4Sb_3$ are described below, and include a crystal growth method and a powder metallurgy method. One crystal growth method for p-type single crystals is a modified Bridgman gradient-freeze technique. Namely a Bridgman Two Zone furnace and a sealed container have been modified for use in preparation of semiconductor materials in accordance with the present invention. A gradient freeze technique can be used in accordance with the present invention to produce a crystal of β-$Zn_4Sb_3$ having a hexagonal rhombohedral crystal structure.

One powder metallurgy method is a hot-pressing method which includes preparing the $Zn_4Sb_3$ compound as polycrystalline samples by direct reaction of elemental powders of Zn and Sb and subsequent hot-pressing. The use of a hot-pressing method in accordance with the present invention produces large, polycrystalline ingots of semiconductor alloys. An isothermal furnace and a sealed container have been modified for use in preparation of semiconductor alloys in accordance with the present invention.

The present invention allows the use of high ZT materials in the manufacture of high efficiency thermoelectric energy conversion devices such as electrical power generators, heaters, coolers, thermocouples and temperature sensors. By using semiconductor alloys to form thermoelectric devices, such as p-type $Zn_4Sb_3$ and related alloys which have been prepared in accordance with the present invention, the overall efficiency of the thermoelectric device is substantially enhanced. For example, thermoelectric elements fabricated from semiconductor materials such as $Zn_4Sb_3$ have figures of merit ZT of about 1.4 at a temperature of about 350 C.

A further important technical advantage includes the use of semiconductor materials prepared in accordance with the present invention in the manufacture of a "Powerstick" power source. Other thermoelectric devices manufactured from semiconductor materials fabricated in accordance with the present invention may be used in waste heat recovery systems, automobiles, remote power generators, temperature sensors and coolers for advanced electronic components such as field effect transistors.

A feature of the present invention is the ability to obtain increased efficiency from a thermoelectric device by using semiconductor materials and desired thermoelectric properties in fabrication of the thermoelectric device. Another feature of the present invention is to have a relatively high thermoelectric figure of merit for a p-type material between 200 C and 350 C. A further feature of the present invention is that the compound $Zn_4Sb_3$ has a complex crystal structure which results in exceptionally low thermal conductivity values which is highly desirable to obtain good thermoelectric properties.

An advantage of the present invention is that the range of applications of thermoelectric generators is expanded. Another advantage is that the thermoelectric materials of the present invention are substantially cheaper than current state-of-the-art thermoelectric materials (such as Bi2Te3-based alloys, PbTe-based alloys, and TAGS (Te—Ag—Ge—Sb)) and are especially viable for applications where cost is critical. A further advantage of the present invention is that higher ZT values can be achieved with additional optimization of the compounds (changing doping levels) and also by forming solid solutions with isostructural compounds, such as $Cd_4Sb_3$. For instance, solid solutions of the present invention can consist of $Zn_{4-x}A_xSb_{3-y}B_y$ wherein $0 \leqq x \leqq 4$ and wherein A is a transition metal, B is a pnicogen, and $0 \leqq y \leqq 3$. In addition, the materials of the present invention can be used in more efficient thermoelectric generators and also for waste heat recovery and automobile industry applications, for example.

The foregoing and still further features and advantages of the present invention as well as a more complete understanding thereof will be made apparent from a study of the following detailed description of the invention in connection with the accompanying drawings and appended claims.

DESCRIPTION OF THE DRAWINGS

Referring now to the drawings in which like reference numbers represent corresponding parts throughout:

FIG. 3*a* is a schematic drawing in elevation and in section with portions broken away showing a Bridgman Two-Zone furnace which may be used to prepare semiconductor materials using gradient freeze techniques in accordance with the present invention;

FIG. 3*b* is a graph showing the temperature gradient associated with growing single crystals of the semiconductor materials in accordance with the present invention;

FIG. 4 is a schematic drawing in elevation and in section with portions broken away showing an isothermal furnace which may be used to initially prepare single phase polycrystalline samples of semiconductor materials having a structure in accordance with the present invention;

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Figure 1:
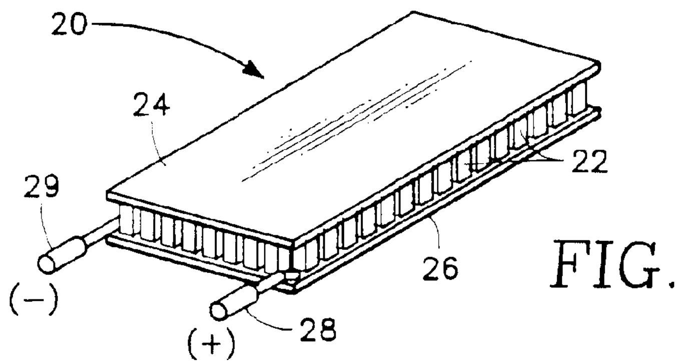
FIG. 1 is an isometric drawing of a thermoelectric device which may be manufactured using materials incorporating the present invention.
Figure 2:
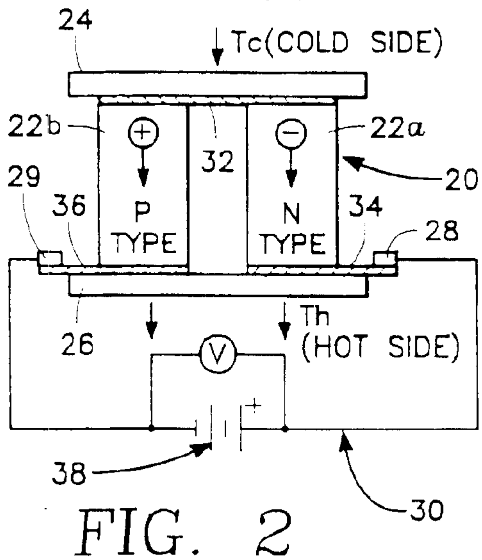
FIG. 2 is a schematic drawing of the electrical circuit associated with the thermoelectric device of FIG. 1.

Thermoelectric Devices:

Thermoelectric device 20, as shown in FIGS. 1 and 2, may be manufactured from semiconductor materials and alloys which have been prepared in accordance with the present invention. The use of such semiconductor materials will substantially increase the energy conversion efficiency of thermoelectric device 20. Thermoelectric device 20 may be used as a heater and/or a cooler.

Thermoelectric device 20 is preferably manufactured with a plurality of thermoelectric elements (sometimes referred to as "thermocouples") 22 disposed between cold plate 24 and hot plate 26. Ceramic materials are frequently used in the manufacture of plates 24 and 26 which define in part the cold side and hot side, respectively, of thermoelectric device 20.

Electrical power connections 28 and 29 are provided to allow attaching thermoelectric device 20 to an appropriate source of DC electrical power. If thermoelectric device 20 was redesigned to function as an electrical power generator, electrical connections 28 and 29 would represent the output terminals from such a power generator operating between hot and cold temperature sources (not shown). Such electrical power generators may be used for various applications such as waste heat recovery systems (not shown), space power systems 200 and "Powerstick" power generators 300.

FIG. 2 is a schematic representation of electrical circuit 30 associated with thermoelectric device 20. Electrical circuit 30 is typical of electrical circuits associated with using thermoelectric elements or thermocouples 22 for heating and/or cooling. Electrical circuit 30, which is typical for a single stage thermoelectric device such as thermoelectric device 20, generally includes two dissimilar materials such as N-type thermoelectric elements 22*a* and P-type thermoelectric elements 22*b*. Thermoelectric elements 22 are typically arranged in an alternating N-type element to P-type element configuration. In many thermoelectric devices, semiconductor materials with dissimilar characteristics are connected electrically in series and thermally in parallel.

A common property of semiconductor materials is that electricity can be conducted by two type of carriers: electrons in N-type materials and holes in P-type materials. In a crystal, when one atom is replaced by another atom with more valence electrons, the extra electrons are not needed for bonding and are free to move throughout the crystal. This type of electrical conduction is called n-type. However, when an atom is replaced by another atom with fewer electrons, a bond is left vacant and this shortage is referred to as a hole. This type of electrical conduction is called P-type. The extra electrons in the N-type semiconductor materials and the extra holes in the P-type semiconductor materials are frequently referred to as "charge carriers." Heat may be conducted between cold side (or cold plate 24) and hot side (or hot plate 26) of thermoelectric elements 22 by charge carriers (electron or holes) and vibrations of the crystal lattice structure. Such lattice vibrations are referred to as "phonons".

In thermoelectric device 20, alternating thermoelectric elements 22 of N-type and P-type semiconductor materials have their ends connected in a serpentine fashion by electrical conductors such as 32, 34 and 36. Conductors 32, 34 and 36 are typically metallizations formed on the interior surfaces of plates 24 and 26. Commercially available thermoelectric coolers frequently include two metallized ceramic plates with P-type and N-type elements of bismuth telluride alloys soldered between the ceramic plates.

When DC electrical power from power supply 38 is applied to thermoelectric device 20 having an array of thermoelectric elements 22, heat energy is absorbed on cold side 24 of thermoelectric elements 22. The heat energy passes through thermoelectric elements 22 and is dissipated on hot side 26. A heat sink (sometimes referred to as the "hot sink", not shown) may be attached to hot plate 26 of thermoelectric device 20 to aid in dissipating heat from thermoelectric elements 22 to the adjacent environment. In a similar manner a heat sink (sometimes referred to as a "cold sink", not shown) may be attached to cold side 24 of thermoelectric device 20 to aid in removing heat from the adjacent environment.

Figure 2A:
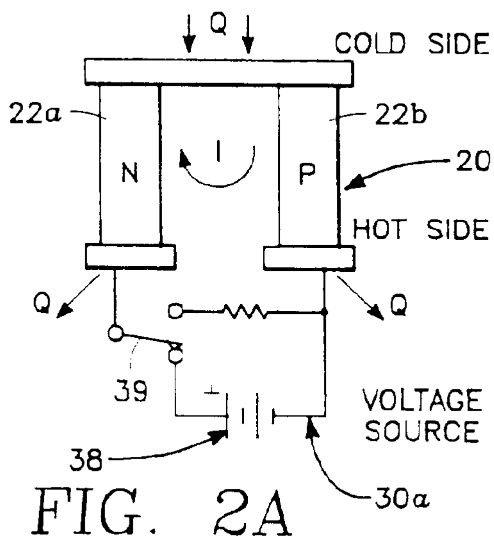
FIG. 2*a* is a schematic drawing of an electrical circuit associated with the thermoelectric device of FIG. 1 functioning as a cooler.
Figure 2B:
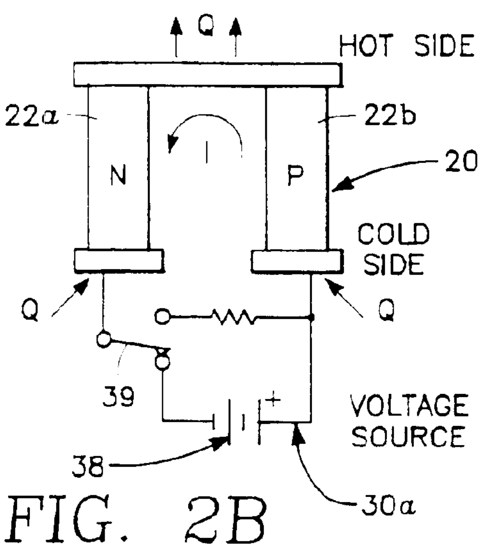
FIG. 2*b* is a schematic drawing of an electrical circuit associated with the thermoelectric device of FIG. 1 functioning as a heat pump.
Figure 2C:
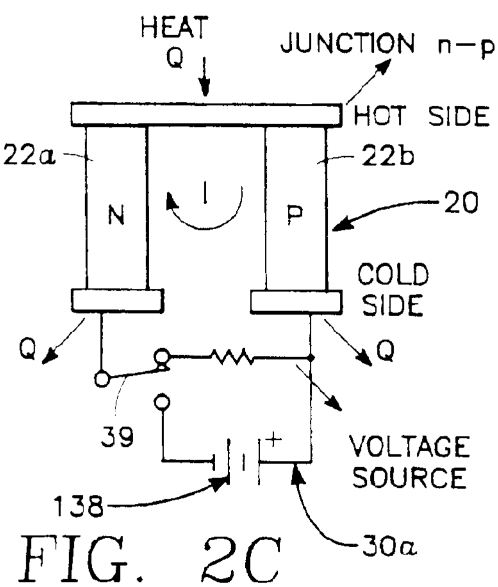
FIG. 2*c* is a schematic drawing of an electrical circuit associated with the thermoelectric device of FIG. 1 functioning as a power generator.

Thermoelectric device 20 may sometimes be referred to as a thermoelectric cooler. However, since thermoelectric devices are a type of heat pump, thermoelectric device 20 may be designed to function as either a cooler, heater, or power generator. FIGS. 2*a* 2*b* and 2*c* are schematic representations showing these alternative uses for thermoelectric device 20. In FIG. 2*a* thermoelectric elements 22 and the electrical circuit 30*a* have been configured to allow thermoelectric device 20 to function as a cooler similar to circuit 30 shown in FIG. 2. FIG. 2*b* demonstrates that changing the position of switch 39 allows essentially the same electrical circuit 30*a* to convert thermoelectric device 20 from a cooler to a heater. In FIG. 2*c* thermoelectric device 20 and electric circuit 20*a* are configured to produce electricity by placing thermoelectric device 20 between a source of high temperature (not shown) and a source of low temperature (not shown).

$Zn_4Sb_3$ and $Zn_4Sb_3$-Based Semiconductor Materials:

Semiconductor materials (sometimes referred to as "semiconductor alloys") based on $\beta$-$Zn_4Sb_3$ have been prepared in accordance with the present invention in the form of p-type crystals and single phase polycrystalline samples. $\beta$-$Zn_4Sb_3$ samples produced in accordance with the present invention are hexagonal rhombohedral, space group R 3C with a=12.231 Å and c=12.428 Å. The band gap of $\beta$-$Zn_4Sb_3$ is approximately 1.2 eV from high temperature electrical measurements and optical measurements.

Preparation:

The present invention is embodied in two methods of preparation of the semiconductor compounds. The first is a gradient freeze technique to produce single crystals of $\beta$-$Zn_4Sb_3$. Crystal growth by the gradient freeze technique is preferably initiated from stoichiometric melts based on the liquid-solid phase diagram associated with the elements which will comprise the resulting semiconductor materials. The second is a powder metallurgy technique to produce single phase polycrystalline samples of $\beta$-$Zn_4Sb_3$ and $Zn_4Sb_3$ based alloys. Depending upon the desired composition of the semiconductor materials either gradient freeze techniques or low temperature powder synthesis with subsequent hot pressing may be used to produce the semiconductor alloys of the present invention. Hot pressing is included as part of the low temperature provider entering process.

Gradient Freeze Method:

In accordance with the present invention, single crystals of $\beta$-$Zn_4Sb_3$ may be grown using gradient freeze techniques and furnace 50 as shown in FIG. 3*a*. Furnace 50, frequently referred to as a Bridgman Two-Zone furnace, includes housing 52 with a first or upper heater assembly 54 and a second or lower heater assembly 56. Housing 52 defines in part chamber 60. Thermal baffle 58 is preferably disposed between first heater assembly 54 and second heater assembly 56 intermediate chamber 60. Various components which comprise furnace 50 are preferably disposed vertically within chamber 60 of housing 52.

As shown in FIG. 3*a*, housing 52 includes end closure 62 which seals the upper portion of chamber 60 and end closure 64 which seals the lower portion of chamber 60. Quartz rod 66 may be vertically disposed within chamber 60. Container 68 is preferably secured to one end of rod 66 adjacent to thermal baffle 58.

The lower portion 70 of container 68 is preferably pointed or tapered with respect to rod 66. Various types of containers 68 may be satisfactorily used with the present invention. A sealed quartz ampoule has been found satisfactory for use with furnace 50. If desired, housing 52 and end closure 64 may be modified to allow a conveyor (not shown) with a plurality of rods 66 and containers 68 to pass sequentially through furnace 50.

Elements such as Zn and Sb shots which will form the desired semiconductor alloy using furnace 50 are preferably sealed within container 68 under a vacuum. Pointed or tapered end 70 of container 68 is attached to quartz rod 66 and disposed vertically within chamber 60. Tapered end 70 and its attachment to rod 66 cooperate to maintain the desired temperature gradients in container 68. Furnace 50 is then heated to establish the desired temperature gradient 69 and controlled cooling 67 as shown in FIG. 3*b*. Various temperature gradients may be used depending upon the elements placed within container 68 to produce the desired semiconductor alloy.

Working Example:

Crystals of β-$Zn_4Sb_3$ were grown by the Bridgman gradient freeze technique. Zinc (99.9999% pure) and antimony shots (99.999% pure) in the ratio (Zn: 57.5%, Sb: 42.5%) were loaded in a quartz ampoule 68 which was sealed under vacuum at approximately $10^{-5}$ Torr. The ampoule 68 was introduced in the two-zone furnace 50 and remained stationary during the growth. A gradient of about 50 degrees/cm and a growth rate of about 0.7 degrees/hour were used in the experiments. The growth process was obtained by lowering the temperature of the furnace.

Crystals of about 12 mm in diameter and up to 2 cm long were obtained by this technique. X-ray diffractometry (XRD) analysis confirmed that the samples were single phase with a structure corresponding to the β-$Zn_4Sb_3$ compound. Also, microprobe analysis showed that the samples were single phase and homogeneous in composition. However, this method may produce samples with macrocracks due the phase transformation occurring upon cooling at 492 C. To avoid the difficulties caused by the formation of cracks during the crystal growth, the present invention is embodied in a preferred powder metallurgy technique to prepare dense, crack-free samples of β-$Zn_4Sb_3$ and related alloys.

Preferred Preparation Method:

Powder Metallurgy Method

Single phase polycrystalline samples of β-$Zn_4Sb_3$ and related alloys may be prepared by using the powder metallurgy method as described below and shown in FIG. 4. Furnace 80 may be referred to as an isothermal furnace as compared to furnace 50 which has two different temperature zones. Furnace 80 includes housing 82 with heater assembly 84 disposed therein. Housing 82 defines in part chamber 90. Various components which comprise furnace 80 are preferably vertically disposed within chamber 90 of housing 82.

Housing 82 includes end closure 92 which seals the upper portion of chamber 90 and end closure 94 which seals the lower portion of chamber 90. Quartz rod 66 is preferably disposed vertically within chamber 90. Container 68 is preferably secured within chamber 90 intermediate end closures 94 and 92 at approximately the mid point of chamber 90.

The elements such as Zn and Sb, which will be used to form the desired semiconductor material, may be sealed within container 68. The lower portion 70 of container 68 may be pointed or tapered with respect to quartz rod 66. For some applications, container 68 may have a relatively flat lower portion 70. The relationship of lower portion 70 with quartz rod 66 cooperate to maintain the desired temperature in container 68 during preparation of the single phase polycrystalline samples of β-$Zn_4Sb_3$. Various types of containers 68 may be satisfactorily used with the present invention. A sealed quartz ampoule has been found satisfactory for use with the present invention. As previously noted for furnace 50, housing 82 and end closure 94 may be modified to allow a conveyor (not shown) to pass a plurality of rods 66 and containers 68 sequentially through furnace 80.

WORKING EXAMPLE

Single phase, polycrystalline samples of β-$Zn_4Sb_3$ were prepared by reacting zinc (99.9999% pure) and antimony (99.999% pure) powders in the ratio (Zn: 57.5 at %, Sb: 42.5 at %) and in the sealed quartz ampoules 68. The loads (weighing about 20 g each) were held at temperatures between 300 and 450 C for about 5 days for homogenization. The resulting powders were ground in an agate mortar. X-ray diffractometry (XRD) analysis confirmed that the powders were single phase after quenching. The powders were sieved, and only grains with a size of 125 μm or less were retained for further processing.

High density samples (99% of the theoretical density) were successfully hot-pressed from the pre-synthesized powders. The hot-pressing was conducted in graphite dies, at a pressure of about 20,000 psi and at a temperature of 350 C. This temperature was found to be optimal to achieve high density samples without decomposition. The samples (about 12 mm in diameter and about 2 cm long) were crack-free and of good mechanical strength. Microprobe analysis confirmed that the samples were single phase after hot-pressing. It should be noted that doping of elemental and alloyed powders can be achieved by introducing the desired amount of dopant or ternary and quaternary element in the initial powder load. By using commercially available hot presses and graphite die containers, this process is quick, cost effective and may be easily adapted to industrial manufacturing of large quantities of β-$Zn_4Sb_3$ based materials of different compositions and doping level.

Results:

Some room temperature properties of β-$Zn_4Sb_3$ are summarized in TABLE I.

TABLE I

| Room temperature properties | β-$Zn_4Sb_3$ |
|---|---|
| Melting point (C.) | 566 |
| Type of formation from the melt | congruent |
| Structure type | hexagonal rhombohedral |

TABLE I-continued

| Room temperature properties | $\beta$-$Zn_4Sb_3$ |
|---|---|
| Number of atoms/unit cell | 66 |
| Lattice parameter | a = 12.231 Å c = 12.428 Å |
| Density (g · cm$^{-3}$) | 6.077 |
| Thermal expansion coefficient (C$^{-1}$) | 1.93 × 10$^{-5}$ |
| Energy bandgap (eV) | 1.2 |
| Conductivity type | ρ |
| Electrical resistivity (mΩ · cm) | 2 |
| Hall mobility (cm$^2$ · V$^{-1}$ · s$^{-1}$) | 30 |
| Hall carrier concentration (cm$^{-3}$) | 9 × 10$^{19}$ |
| Seebeck coefficient (μV · K$^{-1}$) | 120 |
| Thermal conductivity (mW · cm$^{-1}$ · K$^{-1}$) | 9 |

Thermoelectric properties were measured on both crystalline and hot-pressed $\beta$-$Zn_4Sb_3$ samples. The properties were found to be very similar for the two different kind of samples. The results indicated that $\beta$-$Zn_4Sb_3$ is a heavily doped p-type semiconductor. The Hall mobility and Seebeck coefficient values are relatively large at this doping level.

Figure 5:
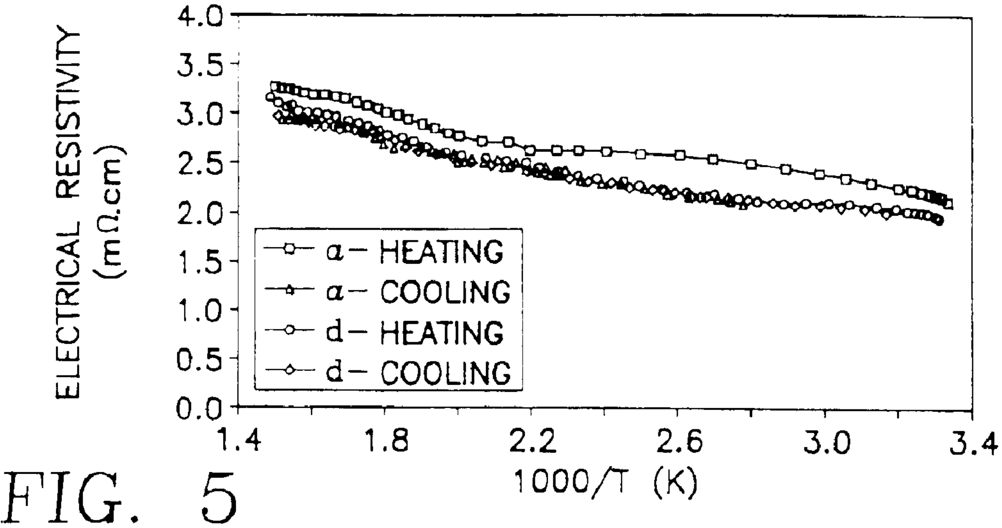
FIG. 5 illustrates typical electrical resistivity values as a function of inverse temperature for p-type $\beta$-$Zn_4Sb_3$.
Figure 6:
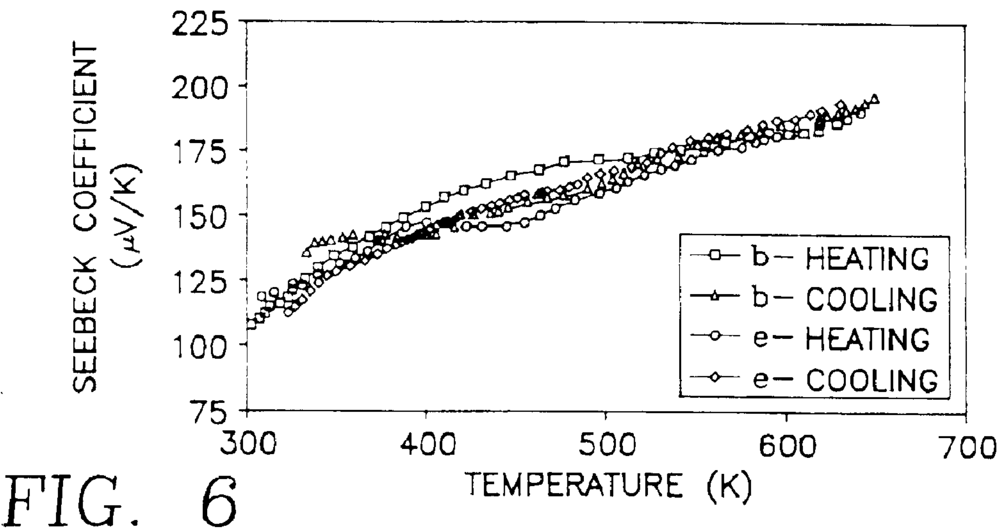
FIG. 6 illustrates typical Seebeck coefficient values as a function of temperature for p-type $\beta$-$Zn_4Sb_3$.
Figure 7:
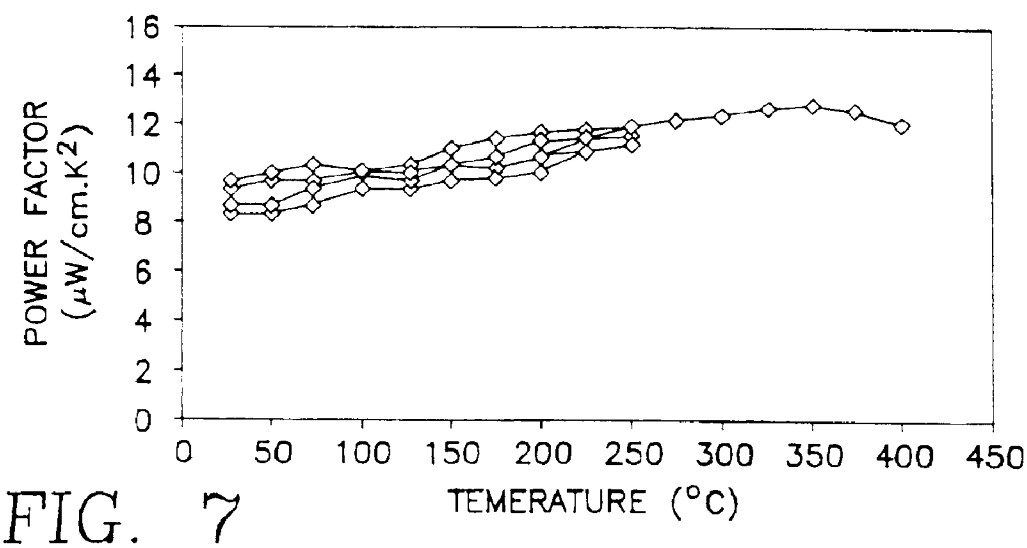
FIG. 7 illustrates typical power factor values ($\alpha^2/\rho$) as a function of temperature for p-type $\beta$-$Zn_4Sb_3$.
Figure 8:
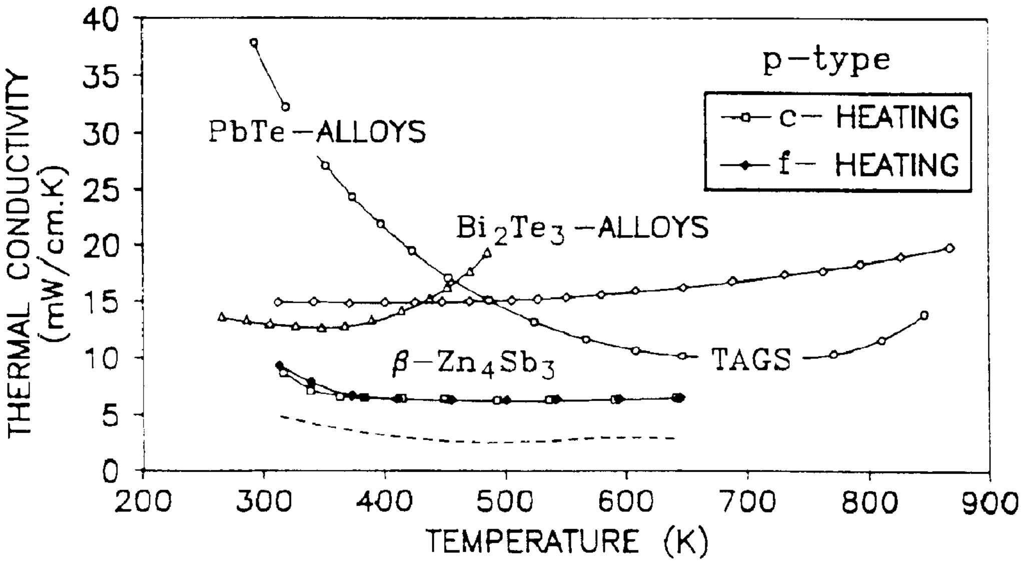
FIG. 8 illustrates typical thermal conductivity values as a function of temperature for p-type $\beta$-$Zn_4Sb_3$ as compared to state-of-the-art p-type thermoelectric materials PbTe and $Bi_2Te_3$ based alloys, and TAGS (Te—Ag—Ge—Sb alloys)

Typical temperature dependence of the thermoelectric properties of the $\beta$-$Zn_4Sb_3$ samples of the present invention are shown in FIG. 5 (electrical resistivity), FIG. 6 (Seebeck coefficient), FIG. 7 (power factor values) and FIG. 8 (thermal conductivity). Intrinsic behavior was not observed in the temperature range of measurement. This is due to the large band gap (1.2 eV) and also to the relatively high doping level of the samples.

FIG. 8 shows the thermal conductivity values of $\beta$-$Zn_4Sb_3$ between room temperature and about 400 C. The values for state-of-the-art p-type thermoelectric materials PbTe- and $Bi_2Te_3$-based alloys as well as TAGS (Te—Ag—Ge—Sb alloys) are also shown for comparison. The room temperature value is about 9 mW.cm$^{-1}$.K$^{-1}$ for $\beta$-$Zn_4Sb_3$ samples. The thermal conductivity decreases to about 6 mW.cm$^{-1}$.K$^{-1}$ at 250° C. for $\beta$-$Zn_4Sb_3$ samples of the present invention. The low thermal conductivity feature of $\beta$-$Zn_4Sb_3$ samples of the present invention is very desirable. This is the lowest of all the thermoelectric materials previously known. A room temperature lattice thermal conductivity of 6.5 mW.cm$^{-1}$.K$^{-1}$ was calculated by subtracting the electronic component to the total thermal conductivity.

As such, the thermal conductivity values for $\beta$-$Zn_4Sb_3$ of the present invention are typical of glass-like materials. This is due to its complex crystal structure and also most likely to the presence of some antistructure defects resulting in a highly disordered structure. However, glass-like materials have usually high electrical resistivity such as $Tl_3AsSe_3$ which is detrimental to good thermoelectric properties. This not the case for $\beta$-$Zn_4Sb_3$ samples of the present invention. In this compound, there is a unique combination of low thermal conductivity and good electrical resistivity which makes it a very desirable thermoelectric material.

The dimensionless figure of merit is a good indication of the viability of thermoelectric semiconductor materials. The dimensionless thermoelectric figure of merit ZT is a function of the electrical resistivity (ρ), the Seebeck coefficient (α) and the thermal conductivity (λ):

$$ZT=\alpha^2/\rho\lambda$$

Figure 9:
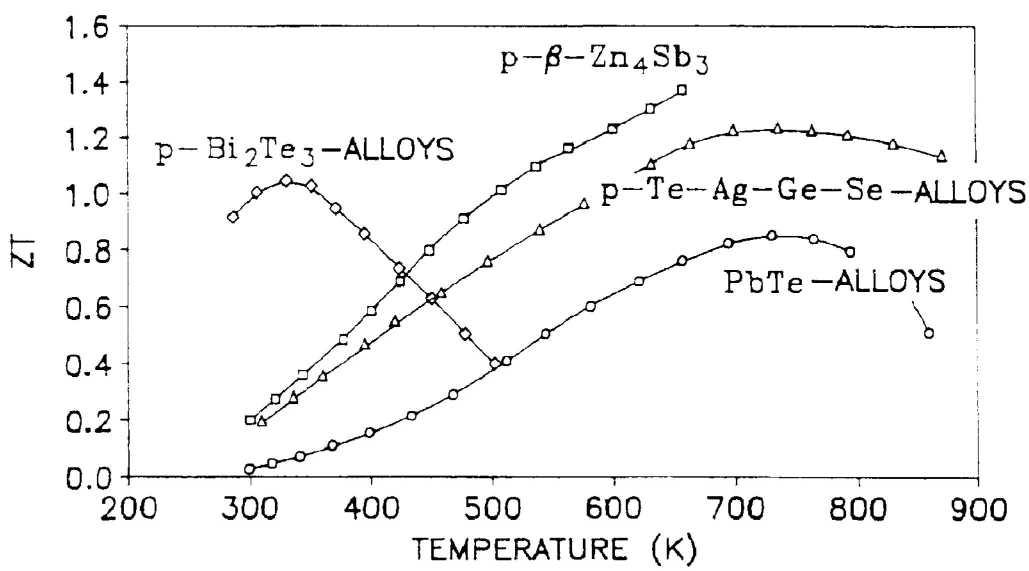
FIG. 9 illustrates the dimensionless figure of merit ZT as a function of temperature for several p-type $\beta$-$Zn_4Sb_3$ samples of the present invention as compared to state-of-the-art p-type thermoelectric materials PbTe and $Bi_2Te_3$ based alloys, and TAGS (Te—Ag—Ge—Sb alloys)

To obtain a large figure of merit, it is desirable to have a large Seebeck coefficient as well as a low electrical resistivity and thermal conductivity. The calculated figure of merit values for several p-type $\beta$-$Zn_4Sb_3$ are shown in FIG. 9. FIG. 9 shows that there is a gap between the low temperature state-of-the-art thermoelectric materials ($Bi_2Te_3$-based alloys) and the intermediate temperature materials (PbTe-based alloys) and TAGS (Te—Ag—Ge—Sb) p-type $\beta$-$Zn_4Sb_3$ of the present invention fills this gap in the 200 C–350 C temperature range. Although TAGS also have a good thermoelectric figure of merit in this temperature range, their use is limited due to their high sublimation rate and low temperature phase transition.

In addition, thermogravimetric studies indicate that $\beta$-$Zn_4Sb_3$ samples of the present invention do not dissociate at all under argon atmosphere up to about 400 C. Electrical resistivity measurements, as well as microprobe analysis of samples annealed for long periods of time in sealed quartz ampoules under vacuum indicate that the samples of the present invention did not dissociate up to about 400 C. However, measurements performed in a dynamic vacuum indicate that decomposition does not exist up to 250 C. But, for higher temperatures, some partial decomposition was observed and some ZnSb inclusions were detected by microprobe analysis.

As described above, p-type $\beta$-$Zn_4Sb_3$ samples of the present invention are made of p-type thermoelectric materials. Thermoelectric devices made with the thermoelectric materials of the present invention can be comprised of p-type $\beta$-$Zn_4Sb_3$ with state-of-the-art n-type thermoelectric materials. For example, p-type $\beta$-$Zn_4Sb_3$ of the present invention can be coupled with n-type PbTe-based alloys and/or n-type $Bi_2Te_3$ based alloys to form a thermoelectric device with increased efficiency, as compared to a thermoelectric device built with n- and p-type PbTe-based alloys and/or n-type $Bi_2Te_3$ based alloys. Also, for many applications using thermoelectric generators, the cost of the material is important. $\beta$-$Zn_4Sb_3$ is relatively cheap compared to prior state-of-the-art thermoelectric materials. For instance, the raw material for $\beta$-$Zn_4Sb_3$ is approximately one-half the cost of $Bi_2Te_3$-based alloys and two-thirds the cost of PbTe-based alloys.

In addition, although P-type $\beta$-$Zn_4Sb_3$ samples have the highest thermoelectric figure of merit values (as compared with previously known compounds) in the 200 C to 350 C temperature range, other solid solutions, such as solid solutions consisting of $Zn_{4-x}A_xSb_{3-y}B_y$ wherein $0 \leqq x \leqq 4$ and wherein A is a transition metal, B is a pnicogen, and $0 \leqq y \leqq 3$ are included in the present invention. For instance, $Cd_4Sb_3$—$Zn_4Sb_3$ solid solutions (as described below), are included in the present invention that have even higher figure of merit values. Most, if not all, state-of-the-art thermoelectric materials are solid solutions. Higher figures of merit values can be achieved by reducing the lattice thermal conductivity in the alloys between isostructural compounds by increasing point defect scattering, as well as by optimizing doping levels.

Semiconductor Alloys Between $Zn_4Sb_3$ and $Cd_4Sb_3$:

In addition to $Zn_4Sb_3$, other $Zn_4Sb_3$ alloy-based materials, such as $Zn_{4-x}A_xSb_{3-y}B_y$ wherein $0 \leqq x \leqq 4$ and wherein A is a transition metal, B is a pnicogen, and $0 \leqq y \leqq 3$. For instance, specific examples, such as $Zn_{4-x}Cd_xSb_3$, are presented herewith. As discussed above, although doping by impurities and stoichiometric deviation controls the electrical properties of $\beta$-$Zn_4Sb_3$ and can also produce samples with n-type conductivity, the following section describes reducing lattice thermal conductivity. Reduction of the lattice thermal conductivity for the alloys of the present invention increases ZT values for $\beta$-$Zn_4Sb_3$ based materials for $Zn_{4-x}Cd_xSb_3$ solid solutions.

WORKING EXAMPLE

Specifically, results have been obtained (discussed below) on alloys between $Zn_4Sb_3$ and $Cd_4Sb_3$ indicating increased ZT values when lattice thermal conductivity is reduced. For instance, a maximum ZT value of 1.4 at a temperature of about 250 C can be obtained for a sample with a composition $Zn_{3.2}Cd_{0.8}Sb_3$. Initial bonding and stability studies are presented below and show that the integration of these materials into thermoelectric devices is possible.

As discussed above, experimental investigation of the thermoelectric properties of p-type β-$Zn_4Sb_3$ samples have shown that this compound has good thermoelectric properties in the 100 C–400 C temperature range. A maximum dimensionless figure of merit ZT of about 1 was reproducibly obtained on hot-pressed β-$Zn_4Sb_3$ sample at a temperature of about 250 C. In addition, even higher figure of merit values are obtainable for solid solutions between β-$Zn_4Sb_3$ and $Cd_4Sb_3$. A maximum figure of merit of about 1.4 was obtained on a solid solution $Zn_{3.2}Cd_{0.8}Sb_3$ at a temperature of about 250 C. Temperature stability tests have shown that these materials are stable in a dynamic vacuum up to about 250 C and up to about 400 C in static vacuum. A Zn—Cd eutectic brazing material was developed to bond the thermoelectric material to Cu-electrodes. The contact resistivity between the electrodes and the thermoelectric material was found to be very low. As such, these new thermoelectric materials are relatively easily incorporated in thermoelectric power generation and cooling devices.

The elements Br, I, Ge, Te, Sn, Si, Pb, Au, Ag, Cr, Mn, Ni, Fe, and Co can effect the properties of hot-pressed β-$Zn_4Sb_3$. Polycrystalline hot-pressed samples can be prepared by the hot-pressing method described above with the following modification. Dopants in concentration between 1% and 2% are added to the original composition, substituting for Zn or Sb. For example, the following maximum atomic concentration of dopant was found in the samples with microprobe analysis: Br (~1.0), I (~1.0), Ge (0.9), Te (0.8), Sn (0.5), Au (0.3), Ag (0.3), Cr (1.6), Mn (0.75), Ni (0.2), Fe (1.1), and Co (2.2).

Since a compound can exist over a range of compositions departing from the exact stoichiometry, the properties of several off-stoichiometric samples are included as part of the present invention. In accordance with the present invention, the standard nominal ratio between Zn and Sb is: Zn(57.5%) and Sb(42.5%). Samples with a Zn concentration of 59, 58, 57, 56, and 55% were prepared in accordance with the present invention. X-ray showed that the samples with 59, 58, 57, and 56% Zn were essentially single phase corresponding to β-$Zn_4Sb_3$. Lines corresponding to the compound ZnSb appeared in the sample containing 55% of Zn. As discussed below, the process described above to prepare the sample is adequate to reproducibly produce large samples of β-$Zn_4Sb_3$ with optimal thermoelectric properties and ZT values very close to the maximum values predicted by the theory.

Figure 10:
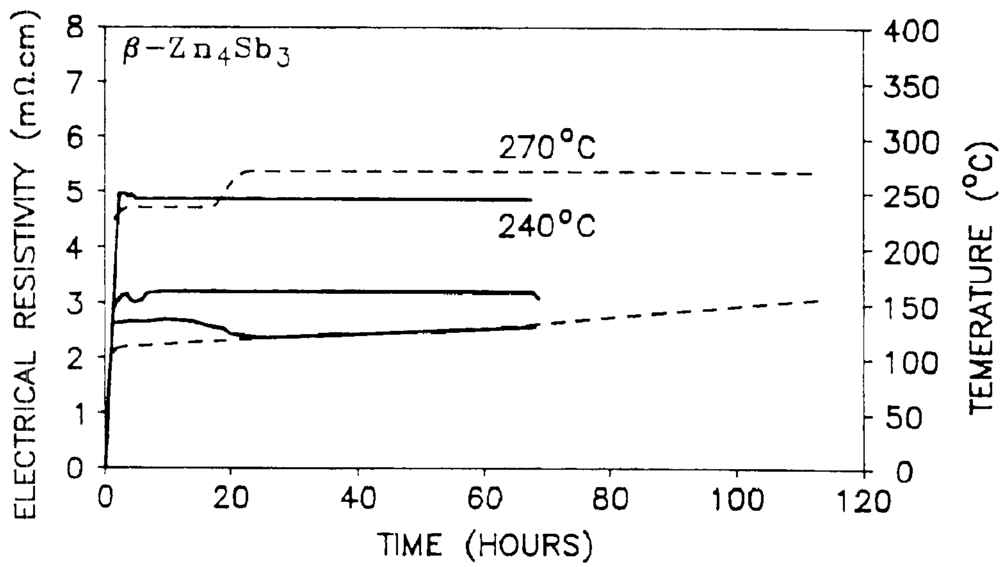
FIG. 10 illustrates electrical resistivity as a function of time for $\beta$-$Zn_4Sb_3$ samples held at elevated temperatures in a dynamic vacuum environment.

Results:

FIG. 10 illustrates electrical resistivity as a function of time for β-$Zn_4Sb_3$ samples held at elevated temperatures in a dynamic vacuum environment. The absence of significant variations demonstrate the stability of the materials in this environment (for temperatures up to 250 C–270 C).

In order to be used in thermoelectric devices, the thermoelectric materials have to be stable at the maximum operating temperature. The thermal stability of β-$Zn_4Sb_3$ hot-pressed samples was investigated by both thermogravimetric and electrical resistivity measurements. Thermogravimetric tests indicate that the samples were stable under argon atmosphere up to about 400 C. Similar tests conducted in static vacuum also indicated that the samples were stable up to the same temperature in that environment. The electrical resistivity of several β-$Zn_4Sb_3$ hot-pressed samples was measured as a function of time for different temperatures in a dynamic vacuum. The results are shown in FIG. 10 and indicate that no significant variation of the electrical resistivity of the sample was observed in dynamic vacuum up to a temperature of about 270° C. For prolonged exposures of the samples at higher temperatures, the electrical resistivity of the samples increased and inclusions of ZnSb were found in the sample by microprobe analysis, likely due to some Sb losses.

Fabrication of a Thermoelectric Device:

To build an actual thermoelectric device, the thermoelectric material is typically cut in small rectangular bars (several mm long) and is bonded to a metallic electrode, usually copper, which provides the electrical current path. Specific soldering/brazing alloys are used to ensure a low resistance electrical contact between Cu and the state-of-the-art thermoelectric materials of the present invention. The composition of the alloy depends on the type of thermoelectric material used, on the maximum temperature on the hot side of the device and on the coefficient of thermal expansion mismatch.

Thus, to incorporate β-$Zn_4Sb_3$ and related alloys into a thermoelectric device, a suitable brazing alloy must be used. This can be resolved in the case of β-$Zn_4Sb_3$-based materials. For instance, several large samples, such as 12 mm in diameter and over 20 mm long, can be brazed to Cu caps (same diameter) using a Zn—Cd eutectic alloy. The melting point of the eutectic mixture can be increased or decreased by increasing or decreasing the content of Zn. An electrical contact resistance measurement determines the quality of the bond between Cu and β-$Zn_4Sb_3$.

WORKING EXAMPLE

Figure 11:
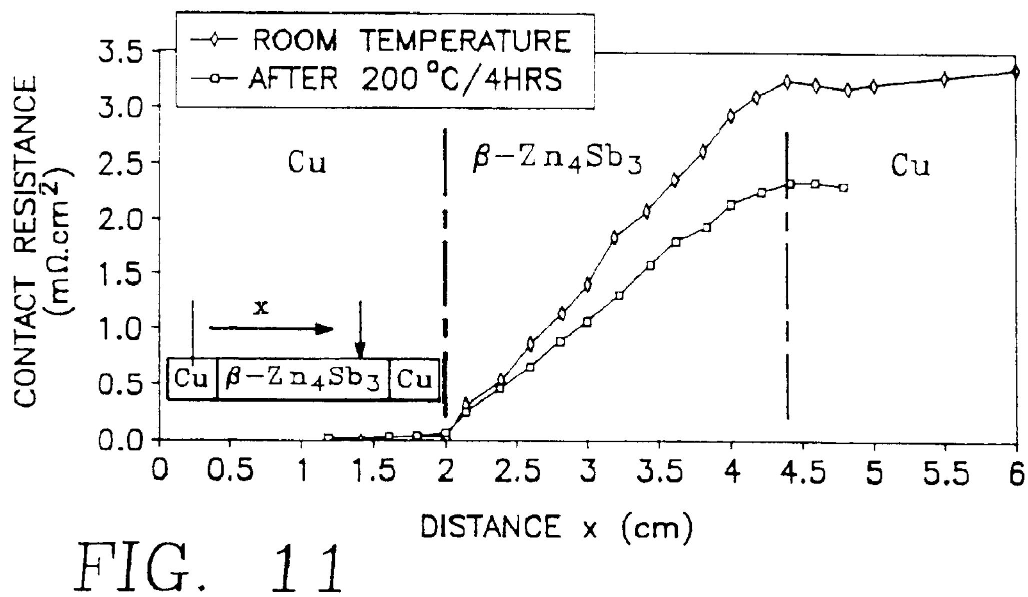
FIG. 11 illustrates electrical contact resistance measurement performed on a cylindrical $\beta$-$Zn_4Sb_3$ sample brazed to a copper cap at each end.

Experimental results were obtained and are shown in FIG. 11. Specifically, FIG. 11 illustrates electrical contact resistance measurement performed on a cylindrical β-$Zn_4Sb_3$ sample brazed to a copper cap at each end (using a 85% Zn-15% Cd eutectic alloy). The two experimental curves (at 25 C and at 200 C) show that the contact resistance between the β-$Zn_4Sb_3$ samples and the Cu caps is negligible, indicating that high quality bonds can be made. The working example was conducted in a dynamic vacuum environment, at room temperature and at 200 C (after several hours of heat-treatment at this temperature). The experimental results, as shown in FIG. 11, show that the transitions from the Cu caps to the β-$Zn_4Sb_3$ material are smooth, indicating that the electrical contact resistance is negligible.

Results with Sample Modeling:

The use of a comprehensive model for the thermal and electrical transport properties of a given material over its full temperature range of usefulness is a powerful tool for guiding experimental optimization of the composition, temperature and doping level, as well as for predicting the maximum figure of merit ZT (and thermoelectric energy conversion efficiency) likely to be achieved. This approach can be used to evaluate the potential for thermoelectric applications of several materials such as n-type and p-type $Si_{80}Ge_{20}$ alloys, n-type and p-type $Bi_2Te_3$-based alloys, p-type $Ru_2Ge_3$ compound, p-type $IrSb_3$ compound and p-type $CoSb_3$—$IrSb_3$ alloys.

Expressions of all the transport properties of thermoelectric semiconductors are derived from the Boltzmann's transport equations for charge carriers and phonons using the relaxation time approximation and generalized Fermi statistics. Various scattering mechanisms can be taken into account by the model to reproduce variations in transport properties due to alloying, grain size, inclusions, etc. The experimental data sets to be fitted, using a generalized non-linear square fit technique, consists of a number of data points providing temperature, composition, electrical conductivity, Hall mobility, Seebeck coefficient, thermal conductivity and dimensionless figure of merit. Using this set of parameters, all thermoelectric properties of the material can be recalculated as a function of carrier concentration, composition and temperature. The optimum doping level(s), composition(s) and temperature(s) for maximum conversion efficiency can thus be determined.

Figure 12:
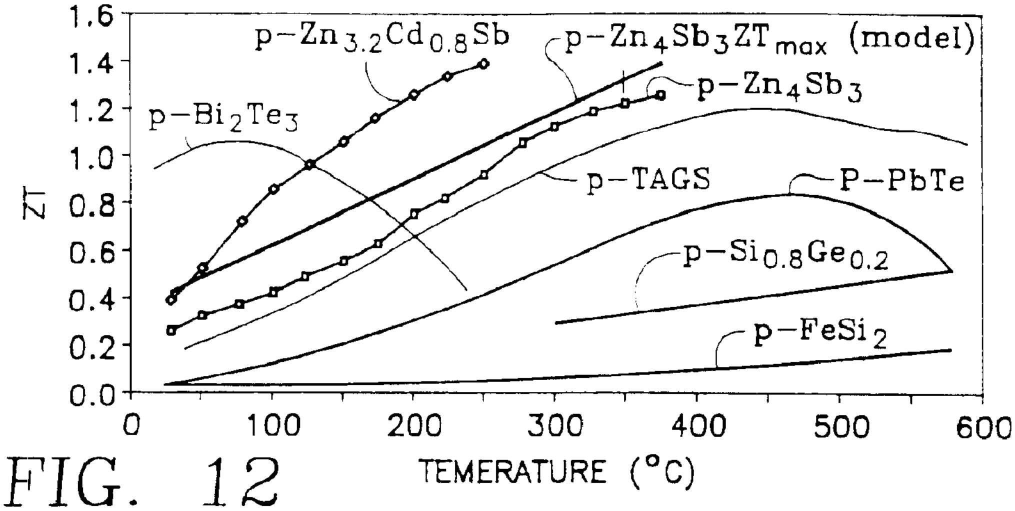
FIG. 12 illustrates the dimensionless figure of merit ZT of several p-type $\beta$-$Zn_4Sb_3$ samples as a function of temperatures.

Preliminary calculations conducted on p-type β-$Zn_4Sb_3$ show that a good fit between experimental and calculated data can be obtained, using a relatively simple band structure configuration. FIG. 12 illustrates the dimensionless figure of merit ZT of several p-type β-$Zn_4Sb_3$ samples as a function of temperatures. The experimental results are compared to the values achieved for state-of-the-art thermoelectric alloys. The maximum values of ZT have been computed for each temperature (at the optimum doping level) and experimental results, as shown in FIG. 12, indicate that the maximum obtainable values are very close to experimental values obtained. As such, the thermal conductivity of β-$Zn_4Sb_3$ samples are reduced, for example by forming $Zn_4Sb_3$—$Cd_4Sb_3$ solid solutions to increase ZT values. It should be noted that $Cd_4Sb_3$ is isostructural to $Zn_4Sb_3$.

Specifically, the ZT values measured on a solid solution $Zn_{3.2}Cd_{0.8}Sb_3$ grown by the gradient freeze technique are described and shown in FIG. 12. FIG. 12 shows that this solid solution has higher ZT values than β-$Zn_4Sb_3$ in the 50 C to 250 C temperature range with a maximum value of 1.4 at 250 C. Also, the ZT values for the $Zn_{3.2}Cd_{0.8}Sb_3$ solid solution and β-$Zn_4Sb_3$ are compared to state-of-the-art thermoelectric materials in FIG. 12. It should be noted that β-$Zn_4Sb_3$-based materials have the highest figure of merit in the 200 C to 400 C temperature range.

Figure 13:
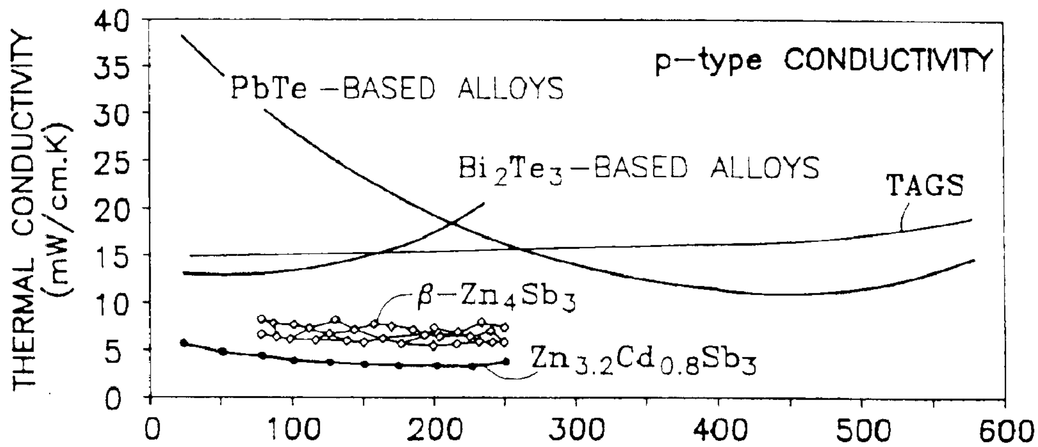
FIG. 13 illustrates typical thermal conductivity values as a function of temperature for p-type $\beta$-$Zn_4Sb_3$ and $Zn_{3.2}Cd_{0.8}Sb_3$ solid solution as compared to state-of-the-art p-type thermoelectric materials PbTe— and $Bi_2Te_3$-based alloys, and TAGS (Te—Ag—Ge—Sb alloys)
Figure 14:
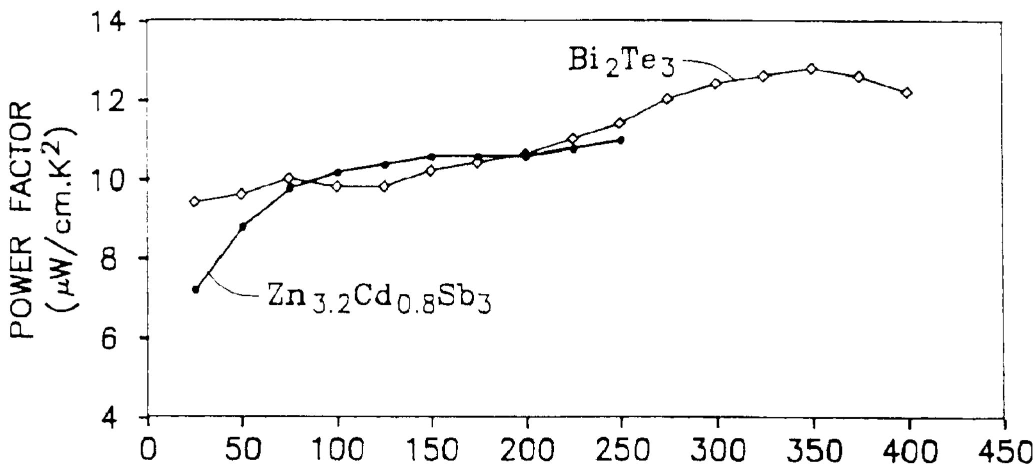
FIG. 14 illustrates typical power factor values ($\alpha^2/\rho$) as a function of temperature for p-type $\beta$-$Zn_4Sb_3$ and $Zn_{3.2}Cd_{0.8}Sb_3$ solid solutions.

Power Factors:

FIG. 13 illustrates typical thermal conductivity values as a function of temperature for p-type β-$Zn_4Sb_3$ and $Zn_{3.2}Cd_{0.8}Sb_3$ solid solution. The results shown in FIG. 13 are compared to state-of-the-art p-type thermoelectric materials PbTe- and $Bi_2Te_3$-based alloys, and also TAGS (Te—Ag—Ge—Sb alloys). FIG. 14 illustrates typical power factor values ($\alpha^2/\rho$) as a function of temperature for p-type β-$Zn_4Sb_3$ and $Zn_{3.2}C_{0.8}Sb_3$ solid solutions.

Thermal conductivity and power factor ($\alpha^2/\rho$) values for p-type β-$Zn_4Sb_3$ and the solid solution $Zn_{3.2}Cd_{0.8}Sb_3$ are shown in FIGS. 13 and 14, respectively. The power factor values for typical β-$Zn_4Sb_3$ and the $Zn_{3.2}Cd_{0.8}Sb_3$ solid solution are similar because of larger Seebeck coefficient values and electrical resistivity for the solid solution. However, thermal conductivity of the solid solution $Zn_{3.2}Cd_{0.8}Sb_3$ is smaller than for β-$Zn_4Sb_3$ (see FIG. 13). This is attributed to an increased scattering of phonons, due to the additional point defects in the solid solutions. The thermal conductivity value is about 6 mW $cm^{-1}$ $K^{-1}$ at room temperature and about 4 mW $cm^{-1}$ $K^{-1}$ at 250 C for the solid solution $Zn_{3.2}Cd_{0.8}Sb_3$. This is about three times lower than for the lowest thermal conductivity measured on any state-of-the-art thermoelectric material. In addition to having low thermal conductivity values, β-$Zn_4Sb_3$-based materials also possess relatively good electrical properties, unlike glass-like materials. Thus, high figure of merit values (ZTs) can be achieved for β-$Zn_4Sb_3$-based materials in accordance with the present invention.

To use β-$Zn_4Sb_3$-based samples in a thermoelectric device, this material must be combined with a n-type thermoelectric material to form the necessary p-n junctions. For example, n-type β-$Zn_4Sb_3$ samples can be prepared with suitable doping. P-type $Zn_4Sb_3$ based materials can be combined with state-of-the-art n-type thermoelectric alloys, such as $Bi_2Te_3$-based compositions (from 0 to 200 C), PbTe-based compositions (200 C to 400 C) or even other materials, such as skutterudites. The improvement in the thermal-to-electric conversion efficiency of thermoelectric generators (TEGs) which could be achieved by using β-$Zn_4Sb_3$-based materials, have been calculated for several configurations in Table II.

TABLE II

| Thermoelectric Generator | | Materials Conversion Efficiency (%) | | |
|---|---|---|---|---|
| Materials for p and n legs | $ZT_{ave}$ (n + p) | DT = 25–250° C. | DT = 100–400° C. | DT = 25–400° C. |
| p/n-$Bi_2Te_3$ | 0.81 | 7.8 | | |
| p-$Zn_4Sb_3$ + n-$Bi_2Te_3$ | 0.67 | 6.8 | | |
| p-$Zn_{4-x}Cd_xSb_3$ + n-$Bi_2Te_3$ | 0.84 | 8.0 | | |
| p/n-PbTe | 0.56 | | 6.2 | |
| p-$Zn_4Sb_3$ + n-PbTe | 0.77 | | 7.8 | |
| p-$Zn_{4-x}Cd_xSb_3$ + n-PbTe | 0.97 | | 9.2 | |
| p-$Zn_{4-x}Cd_xSb_3$ + "n-$Zn_4Sb_3$"* | 1.37 | | 11.5 | |
| p/n-PbTe + p/n-$Bi_2Te_3$ | 0.74 | | | 10.0 |
| p-$Zn_4Sb_3$/n-PbTe + p/n-$Bi_2Te_3$ | 0.87 | | | 11.3 |
| p-$Zn_{4-x}Cd_xSb_3$/ n-PbTe + p/n-$Bi_2Te_3$ | 1.02 | | | 12.6 |
| p/"n"-$Zn_{4-x}Cd_xSb_3$ + p/n-$Bi_2Te_3$* | 1.28 | | | 14.6 |

*Using a n-type $Zn_4Sb_3$-based material made in accordance with the present invention with characteristics identical to the p-type material.

Table II illustrates materials conversion efficiency calculated for a thermoelectric generator operating at different temperature ranges and for different combination of thermoelectric materials. For the 25 C–400 C range, the calculations correspond to a two-stage generator (first stage is p-type/ n-type $Bi_2Te_3$ alloys from 25 up to 150 C).

Most of the improvement (up to 50%) is obtained at intermediate temperatures from 100 to 400° C., by replacing p-type PbTe. At lower temperatures, there are no significant benefits compared to $Bi_2Te_3$-based alloys. Thus, high performance n-type materials (labeled "n-$Zn_4Sb_3$" in Table 1) can be developed in accordance with the present invention with ZT values similar to those obtained for p-type $Zn_{4-x}Cd_xSb_3$ alloys in order to improve conversion efficiency.

Applications:

There are many applications for relatively efficient thermoelectric power generators using the thermoelectric materials of the present invention in this temperature range. For example, typical generators operate on natural gas, propane or diesel and use $Bi_2Te_3$ or PbTe alloys of the prior art, depending on the maximum hot side temperature (up to 600 C). Despite the relatively low efficiency of these prior materials, devices using these materials are used in various industrial applications because of their high reliability, low maintenance, and long life, in particular when considering harsh environments. The most common applications are for cathodic protection, data acquisition and telecommunications. As such, the materials of the present invention would provide relatively more efficient thermoelectric power generators.

There is a growing interest for waste heat recovery power generation, using various heat sources such as the combustion of solid waste, geothermal energy, power plants, and other industrial heat-generating processes. Thus, it is desirable to have large scale waste heat recovery thermoelectric generators using the materials of the present invention.

Specifically, large efforts have been initiated to develop thermoelectric power generation systems to recover waste heat from various sources, such as solid waste, geothermal, power plants, and automobiles. Many potential applications have heat sources in the 100 C to 400 C temperature range where the thermoelectric properties of the materials of the present invention are optimal.

For example, a study of a thermoelectric generation system using the waste heat of phosphoric acid fuel cells was recently proposed in the Proceedings of the *XIII$^{th}$ International Conference on Thermoelectrics,* by Y. Hori, T. Ito, and Y. Kuzuma, Kansas City, Mo., American Institute of Physics, AIP Conference No. 316, pp. 497–500 (1995). In this system, the hot side of the heat source is at a temperature of about 200 C and the cold side is at room temperature. Another potential application was also recently described using geothermal heat from North Sea oil platforms in *MTS Journal* 27, 3 (1994) 43, by D. M. Rowe. Heat source with temperatures between 100 C to 200 C are available from these oil platforms and the potential use of a thermoelectric generator to recover this heat was described.

Also, the automotive industry can use the new materials of the present invention. Because of the need for cleaner, more efficient cars, car manufacturers worldwide are interested in using the waste heat generated by the vehicle exhaust to replace or supplement the alternator. If successful, more power would become available to the wheels and the fuel consumption would decrease. According to some car manufacturers, the available temperature range would be from 100 C to 400 C, which is matched perfectly by the performance of materials of the present invention.

In addition to these applications, because of its high ZT values and relatively low cost, these novel materials might be used in smaller thermoelectric devices, such as low power output micro-generators. For example, the alternator could be supplemented by a thermoelectric generator using the heat generated from the car exhaust system. This would increase the car performance by several miles a gallon and also reduce emissions.

Further, the materials of the present invention could be used in thermoelectric cooling devices to cool field effect transistors from an ambient temperature of 300 C to their maximum value of about 125 C. In all of these systems, one of the most important factors is cost, the materials of the present invention are cheaper (and more environmentally friendly) than the prior art materials.

Specific Example Applications:

Multiple stage thermoelectric coolers (not shown) are typically fabricated by vertically stacking two or more single stage thermoelectric devices. Each ascending thermoelectric device will have fewer thermoelectric elements or thermocouples. A multiple stage thermoelectric cooler is therefore typically pyramid shaped because the lower stage requires more thermoelectric elements to transfer the heat dissipated from the upper stage in addition to the heat pumped from the object being cooled by the multiple stage thermoelectric cooler. Field effect transistors operating at high temperature are desirable and may be cooled from 300 C to 125 C by using such multiple stage thermoelectric coolers having thermoelectric elements fabricated in accordance with the present invention.

P-type semiconductor materials prepared in accordance with the present invention may be used to provide a portion of the thermoelectric elements in a multiple stage thermoelectric cooler. Currently available N-type semiconductor materials such as $Bi_2Te_3$ or any other suitable N-type semiconductor material may be used to provide another portion of the thermoelectric elements. The resulting combination substantially enhances the performance of the thermoelectric device. This combination of P-type and N-type semiconductor materials is particularly useful in the 100 C to 400 C temperature range.

Figure 15:
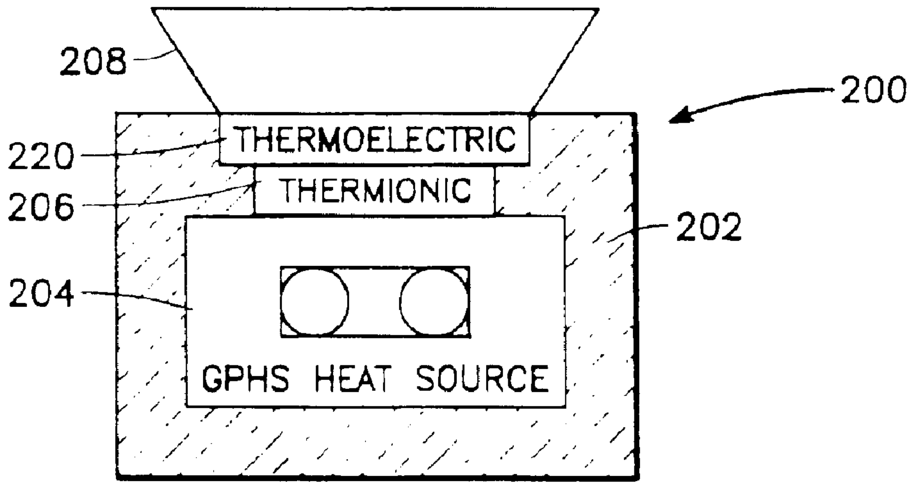
FIG. 15 is a schematic representation of a hybrid thermionic-thermoelectric power generator which may be manufactured with thermoelectric materials incorporating the present invention.

A two stage hybrid thermionic-thermoelectric generator 200 is shown in FIG. 15. Generator 200 preferably includes protective housing 202 with a general purpose heat source 204 disposed therein. Thermionic device 206 is disposed adjacent to heat source 204. Thermoelectric device 220 may be placed adjacent to thermionic device 206. Thermoelectric device 220 will preferably include one or more thermoelectric elements (not shown) which have been fabricated from thermoelectric alloys in accordance with the present invention. One or more fin type radiators 208 are disposed on the exterior of housing 202. Radiator 208 cooperates with heat source 204 to establish a temperature gradient across thermionic device 206 and thermoelectric device 220. By using thermoelectric elements fabricated in accordance with the present invention, the energy conversion efficiency of thermoelectric device 220 is substantially enhanced. Also, single stage thermoelectric devices can be manufactured from thermoelectric elements fabricated in accordance with the present invention to improve the overall design feasibility of hybrid thermionic/thermoelectric generators.

Figure 16:
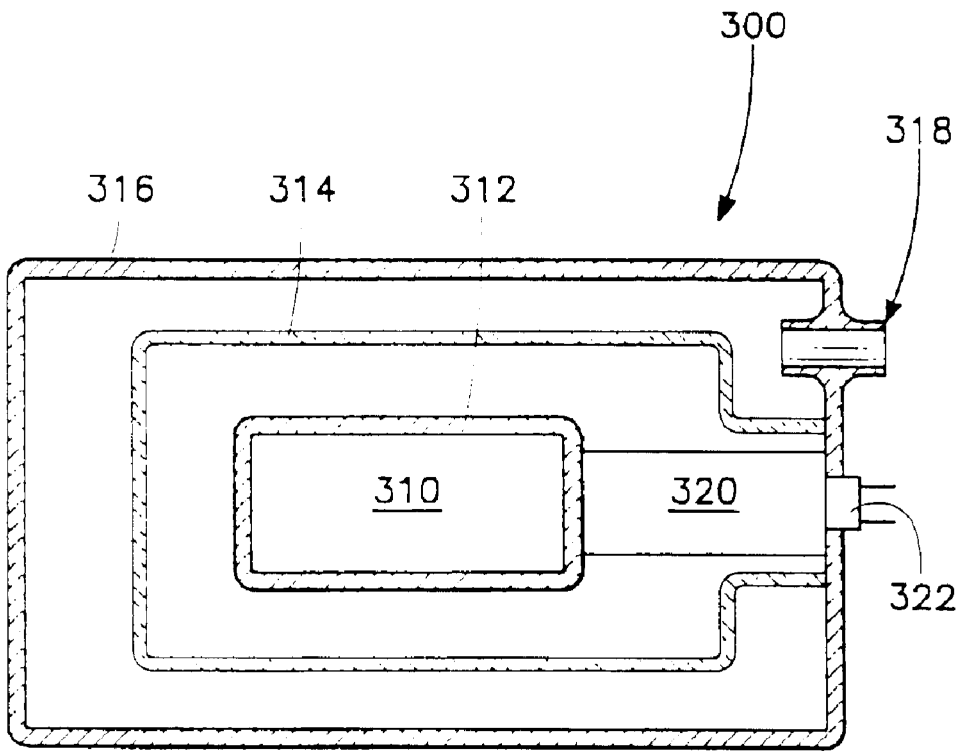
FIG. 16 is a schematic of a miniature power source that consists of a Radioisotope Heater Unit (RHU) and a thermoelectric thermopile which may be manufactured with thermoelectric materials incorporating the present invention.

In addition, the semiconductor materials prepared in accordance with the present invention can be used in the manufacture of a Powerstick power source. FIG. 16 is a schematic of a miniature power source (Powerstick 300) that consists of a Radioisotope Heater Unit (RHU) and a thermoelectric thermopile which may be manufactured with thermoelectric materials incorporating the present invention.

Referring to FIG. 16, the "Powerstick" is a miniaturized, versatile power source which can be used for example on spacecraft, instruments, and interplanetary missions. The Powerstick uses a radioisotope heating unit (RHU) 310, such as a flight-qualified, DoE-manufactured, 1.1 W RHU, to generate a high temperature sink for a thermoelectric converter (TEC) 320, which may be manufactured with thermoelectric materials incorporating the present invention. The TEC 320 generates sufficient electrical power, for instance –40 mW, to trickle-charge a rechargeable battery pack. The battery power can then be used in low duty cycle, low power applications.

The RHU is surrounded by a RHU housing 312 with a radiation shield 314. A vacuum housing 316 surrounds the RHU 310 and TEC 320 to keep the RHU 312 in a vacuum environment. A vacuum port 318 is connected to the vacuum housing 316. An electrical feed-through 322 is coupled to the TEC 320 for an electrical power feed (for more detail on powersticks, see for example: A. Chmielewski and R. E. Ewell, 29th Intersociety Energy Conversion Engineering Conference, Monterey, Calif., pp. 311–315, Aug. 7–11, 1994).

This concludes the description of the preferred embodiment of the invention. The foregoing description of the invention's preferred embodiment has been presented for the purposes of illustration and description. It is not intended to be exhaustive or to limit the invention to the precise form disclosed. Many modifications and variations are possible in the light of the above teaching. It is intended that the scope of the invention be limited not by this description, but rather by the claims appended hereto.

What is claimed is:

1. A high performance p-type thermoelectric alloy having single phase and polycrystalline $Zn_4Sb_3$ material alloyed with $Zn_{3.2}Cd_{0.8}Sb_3$.

* * * * *